(12) United States Patent
Kolics et al.

(10) Patent No.: US 8,790,465 B2
(45) Date of Patent: Jul. 29, 2014

(54) POST-DEPOSITION CLEANING METHODS FOR SUBSTRATES WITH CAP LAYERS

(71) Applicant: Lam Research Corporation, Fremont, CA (US)

(72) Inventors: Artur Kolics, Fremont, CA (US); Shijian Li, San Jose, CA (US); Tiruchirapalli Arunagiri, Newark, CA (US); William Thie, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/849,449

(22) Filed: Mar. 22, 2013

(65) Prior Publication Data

US 2013/0323410 A1  Dec. 5, 2013

Related U.S. Application Data

(62) Division of application No. 12/334,462, filed on Dec. 13, 2008, now Pat. No. 8,404,626.

(51) Int. Cl.
*C23G 1/14* (2006.01)
*C23G 5/02* (2006.01)
*B08B 3/04* (2006.01)

(52) U.S. Cl.
USPC ............ 134/1.3; 134/2; 510/175; 510/178; 510/245; 510/258

(58) Field of Classification Search
USPC ............ 510/175, 178, 245, 258; 134/1.3, 2
See application file for complete search history.

(56) References Cited

U.S. PATENT DOCUMENTS

| | | | |
|---|---|---|---|
| 5,909,742 A | 6/1999 | Ouyang et al. | |
| 6,514,921 B1 | 2/2003 | Kakizawa et al. | |
| 6,794,288 B1 | 9/2004 | Kolics et al. | |
| 6,846,519 B2 | 1/2005 | Ivanov et al. | |
| 6,902,605 B2 | 6/2005 | Kolics et al. | |
| 6,911,067 B2 | 6/2005 | Kolics et al. | |
| 6,913,651 B2 | 7/2005 | Ivanov et al. | |
| 7,216,653 B2 | 5/2007 | Kim et al. | |
| 7,247,579 B2 | 7/2007 | Ren et al. | |
| 7,265,040 B2 | 9/2007 | Kim et al. | |
| 7,273,813 B2 | 9/2007 | Emami et al. | |
| 7,288,156 B2 | 10/2007 | Isago et al. | |
| 2001/0052351 A1 | 12/2001 | Brown et al. | |
| 2003/0181040 A1 | 9/2003 | Ivanov et al. | |
| 2003/0235983 A1 | 12/2003 | Li et al. | |
| 2004/0134375 A1 | 7/2004 | Kolics et al. | |

(Continued)

FOREIGN PATENT DOCUMENTS

JP   200484056 A   3/2004
JP   2005307187 A   11/2005

(Continued)

*Primary Examiner* — Brian P Mruk
(74) *Attorney, Agent, or Firm* — Beyer Law Group LLP

(57) ABSTRACT

One embodiment of the present invention is a method of fabricating an integrated circuit. The method includes providing a substrate having a metal and dielectric damascene metallization layer and depositing substantially on the metal a cap. After deposition of the cap, the substrate is cleaned with a solution comprising an amine to provide a pH for the cleaning solution of 7 to about 13. Another embodiment of the presented invention is a method of cleaning substrates. Still another embodiment of the present invention is a formulation for a cleaning solution.

23 Claims, 1 Drawing Sheet

(56) References Cited

U.S. PATENT DOCUMENTS

| | | |
|---|---|---|
| 2004/0175509 A1 | 9/2004 | Kolics et al. |
| 2004/0253826 A1 | 12/2004 | Ivanov et al. |
| 2005/0101130 A1* | 5/2005 | Lopatin et al. ............... 438/678 |
| 2005/0205835 A1 | 9/2005 | Tamboli et al. |
| 2005/0221015 A1 | 10/2005 | Ivanov et al. |
| 2005/0236362 A1 | 10/2005 | Aoki et al. |
| 2007/0235061 A1 | 10/2007 | Mizuta et al. |
| 2008/0076688 A1 | 3/2008 | Barnes et al. |
| 2009/0239777 A1 | 9/2009 | Angst et al. |

FOREIGN PATENT DOCUMENTS

| | | | |
|---|---|---|---|
| WO | 2006127885 A1 | 11/2006 | |
| WO | 2008144501 A2 | 11/2008 | |
| WO | 2008144501 A3 | 11/2008 | |
| WO | WO 2008/144501 * | 11/2008 | ............... C11D 1/00 |
| WO | 2009086231 A2 | 7/2009 | |
| WO | 2009086231 A3 | 7/2009 | |

* cited by examiner

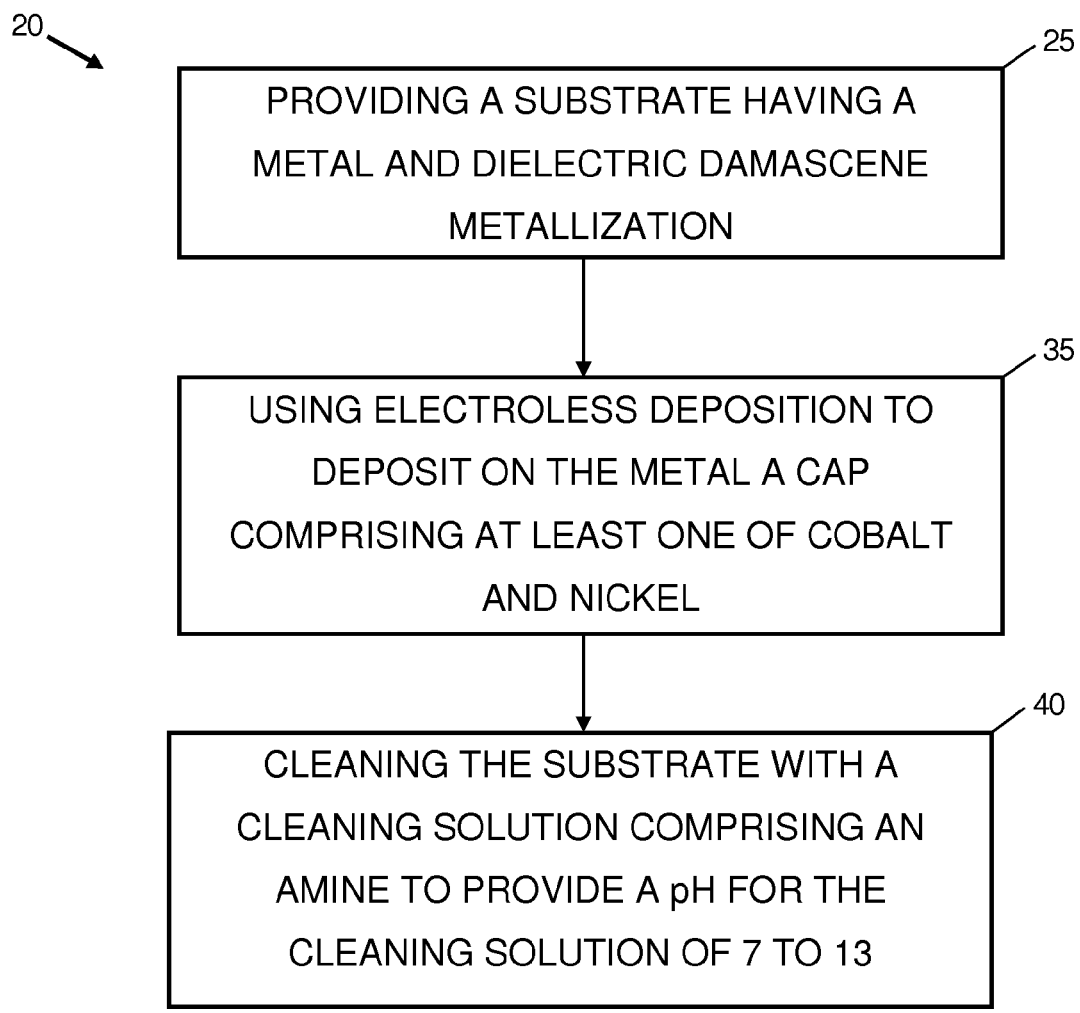

POST-DEPOSITION CLEANING METHODS FOR SUBSTRATES WITH CAP LAYERS

CROSS REFERENCES

The present application is a divisional of U.S. patent application Ser. No. 12/334,462, titled "POST-DEPOSITION CLEANING METHODS AND FORMULATIONS FOR SUBSTRATES WITH CAP LAYERS," to KOLICS et al., filed Dec. 13, 2008, projected issue date Mar. 26, 2013, projected U.S. Pat. No. 8,404,626. This application claims benefit of U.S. Patent Application Ser. No. 61/016,427, titled "POST-DEPOSITION CLEANING METHODS AND FORMULATIONS FOR SUBSTRATES WITH CAP LAYERS" to KOLICS et al., filed Dec. 21, 2007. U.S. patent application Ser. No. 12/334,462 (U.S. Pat. No. 8,404,626) and U.S. Patent Application Ser. No. 61/016,427 are incorporated herein, in their entirety, by this reference.

BACKGROUND

This invention pertains to fabrication of electronic devices such as integrated circuits; more specifically, this invention relates to methods and formulations for cleaning substrates having cap layers containing at least one of the chemical elements cobalt and nickel on metal and dielectric damascene metallization structures.

Cleaning of surfaces having heterogeneous compositions is challenging. This is particularly true in situations such as for surfaces that are subject to corrosion and such as surfaces having different corrosion rates for the heterogeneous compositions. The problem is greater still for surfaces having thin film layers such as layers used in fabricating electronic devices. For electronic device fabrication, surfaces having films around 20 nm thick need to be cleaned while avoiding degradation of the surface quality and thickness of the films.

In a specific case, a metal cap is applied to copper interconnects that are embedded in a dielectric structure to form a damascene metallization layer. In order to provide good electrical performance such as low leakage current with good yield, high breakdown voltage and time dependent dielectric breakdown, the surface of the metal cap and the surface of the dielectric area are preferably cleaned so as to remove contaminants and defects. During this treatment, the metal cap should not suffer significant metal loss, or experience pitting or other forms of localized corrosion. Examples of materials for the metal cap are materials such as cobalt, cobalt alloy, cobalt-nickel alloy, nickel, and nickel alloy. In addition, defects such as particles and residues have to be removed from the entire wafer.

There is a need for cleaning solutions and methods of cleaning substrates that can be used to fabricate electronic devices. More specifically, there is a need for improved solutions and methods that can meet the requirements for such devices.

SUMMARY

This invention pertains to fabrication of electronic devices. One embodiment of the present invention is a method of fabricating an integrated circuit. The method includes providing a substrate having a metal and dielectric damascene metallization layer and depositing substantially on the metal a cap. After deposition of the cap, the substrate is cleaned with a solution comprising an amine to provide a pH for the cleaning solution of 7 to about 13. Another embodiment of the presented invention is a method of cleaning substrates. Still another embodiment of the present invention is a formulation for a cleaning solution.

It is to be understood that the invention is not limited in its application to the details of construction and to the arrangements of the components set forth in the following description or illustrated in the drawings. The invention is capable of other embodiments and of being practiced and carried out in various ways. In addition, it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods, and systems for carrying out aspects of the present invention. It is important, therefore, that the claims be regarded as including such equivalent constructions insofar as they do not depart from the spirit and scope of the present invention.

BRIEF DESCRIPTION OF THE DRAWINGS

FIG. 1 is a process flow diagram of an embodiment of the present invention.

DESCRIPTION

The present invention pertains to interconnect metallization that uses an electrically conductive metal with a cap and a dielectric forming a damascene metallization structure for electronic devices such as integrated circuits. More preferably, the present invention pertains to interconnect metallization layers that include a dielectric and a metal, such as copper, having a cap comprising one of the chemical elements cobalt and nickel for electronic devices.

The operation of embodiments of the present invention will be discussed below, primarily in the context of processing semiconductor wafers such as silicon wafers used for fabricating integrated circuits. The metallization layers for the integrated circuits include copper for metal lines with electrolessly deposited caps comprising at least one of the chemical elements cobalt and nickel or their alloys formed into damascene or dual damascene dielectric structures. Optionally, the dielectric is a low k dielectric material such as a carbon doped silicon oxide (SiOC:H). However, it is to be understood that embodiments in accordance with the present invention may be used for other semiconductor devices, metals other than copper, and wafers other than semiconductor wafers.

Reference is now made to FIG. 1 where there is shown a process flow 20 for fabricating electronic devices according to one embodiment of the present invention. Process flow 20 includes providing a substrate having a metal and dielectric damascene metallization, step 25. Process flow 20 also includes using electroless deposition to deposit on the metal a cap comprising at least one of the chemical elements cobalt and nickel, step 35. After step 35, process flow 20 includes cleaning the substrate with a cleaning solution comprising an amine to provide a pH of 7 to 13 for the cleaning solution, step 40. More specifically, the amine is capable of raising the pH of the cleaning solution to a value in the range of 7 to 13 and all values and subranges subsumed therein. As an option, the cleaning solution may comprise two or more amines and at least one of the two or more amines is capable of raising the pH of the cleaning solution to a value in the range of 7 to 13 and all values and subranges subsumed therein. According to a preferred embodiment of the present invention, the pH of the cleaning solution is a value from about 8 to about 11.5.

Numerous compounds are suitable for use as the amine in embodiments of the present invention. A list of suitable compounds for amines for embodiments of the present invention includes, but is not limited to, primary alkylamines; secondary alkylamines; tertiary alkylamines; quaternary alkylamines; primary arylamines; secondary arylamines; tertiary arylamines; quaternary arylamines; ammonia; primary alkanolamines; secondary alkanolamines; tertiary alkanolamines such as ethanolamine, diethanolamine, triethanolamine, choline; amines with mixed alkyl and alkanol functionalities; tetramethylguanidine; hydroxylamine; and combinations thereof. Amine molecules usually have the general formula $R_{3-x}NH_x$ where R is a hydrocarbon and $0 \leq x \leq 3$. Some embodiments of the present invention include one or more amines present in the cleaning solution in amounts ranging from about 1 gram per liter to about 100 grams per liter (g/L). A preferred embodiment of the present invention includes deionized water in the cleaning solution.

For the purpose of the present disclosure, cleaning the substrate includes removing contaminants, removing defects, or removing contaminants and removing defects. The composition of the cleaning solution is selected so as to facilitate removal of defects and/or contaminants from the surface of the substrate, more particularly the surface of the cap and surface of the dielectric. More preferably, the composition of the cleaning solution is selected so as to clean the surface of the cap and the surface of the dielectric with negligible or substantially no reduction in the thickness of the cap. Preferably, the thickness of the cap is reduced by less than 15% as a result of the cleaning. More preferably, the thickness of the cap is reduced by less than 10% as a result of the cleaning. According to one embodiment of the present invention, the thickness of the cap is reduced by less than 1.5 nm.

Embodiments of the present invention as presented in FIG. 1 may include using a cleaning solution that contains one or more additional additives. As an option for some embodiments of the present invention, the cleaning solution further comprises one or more complexing agents and at least one of the one or more complexing agents is not an amine. For the present disclosure, the complexing agent that is not an amine is referred to as a non-amine complexing agent. The amine complexing agent is defined here as a chemical compound in which the only functional group in the compound that forms a complex has the general formula NRR'R" where N is a nitrogen atom and R, R', and R" can be hydrogen, alkyl or aromatic groups.

Numerous compounds are suitable for use as complexing agents in embodiments of the present invention. A list of complexing agents for embodiments of the present invention includes, but is not limited to, carboxylic acids, hydroxycarboxylic acids, amino acids, phosphonic acid, phytic acid, organic acids where Ig K for CoL>2, and combinations thereof. Some embodiments of the present invention include one or more complexing agents present in the cleaning solution in amounts ranging from about 0.5 gram per liter to about 50 grams per liter.

As an option, some embodiments of the present invention as presented in FIG. 1 may include using a cleaning solution that also contains one or more corrosion inhibitors to substantially protect the cap film or retard the dissolution of the cap in the cleaning solution. As indicated above, preferred embodiments of the present invention are capable of cleaning the substrate with negligible or substantially no reduction in the thickness of the cap; one or more corrosion inhibitor compounds may be included in embodiments of the present invention for that purpose.

Numerous compounds are suitable for use as corrosion inhibitors in embodiments of the present invention. A list of corrosion inhibitors for embodiments of the present invention includes, but is not limited to, triazole and its derivatives such as benzotriazole, methyl-benzotriazole, carboxy-benzotriazole, hydroxybenzotriazole; thiazole and its derivatives such as mercaptobenzothiazole; polyvinylpyrrolidone; polyvinylalcohol and its derivatives; polyalkylimines; polyethylenimines; long chain alkylamines; tetrazoles; orthophosphates; metaphosphates; phosphites; phosphonates; silicates; alkylphosphonates; alkoxysilanes, nitrites; bicyclohexylammonium nitrite; and combinations thereof. Some embodiments of the present invention include one or more corrosion inhibitors present in the cleaning solution in amounts ranging from about 0.01 gram per liter to about 20 grams per liter.

As an option, some embodiments of the present invention as presented in FIG. 1 may include using a cleaning solution that also contains one or more oxygen scavenger compounds to remove dissolved oxygen from the cleaning solution. More specifically, the oxygen scavenger provides a lower concentration of dissolved oxygen in the cleaning solution. Preferably, the amount of dissolved oxygen is kept to a minimum so as to substantially prevent oxidation of the cap by the dissolved oxygen.

Numerous compounds are suitable for use as oxygen scavengers for dissolved oxygen in embodiments of the present invention. A list of oxygen scavengers for embodiments of the present invention includes, but is not limited to, hydroxylamine and derivatives such as diethylhydroxylamine; methyl-ethylketoxime; carbohydrazide; L-ascorbic acid; D-ascorbic acid, derivatives of ascorbic acid; chlorogenic acid; hydrazine, hydrazine salts; derivatives of hydrazine; caffeic acid; phytic acid; luteolin; sulfites; and combinations thereof. Some embodiments of the present invention include one or more oxygen scavengers present in the cleaning solution in amounts ranging from about 0.05 gram per liter to about 10 grams per liter. Preferred embodiments of the present invention maintain concentrations of dissolved oxygen in the cleaning solution at less than 1 part per million (ppm). For some embodiments of the present invention, the low levels of dissolved oxygen are obtained by providing a sufficient amount of one or more oxygen scavengers.

As an option, some embodiments of the present invention as presented in FIG. 1 may include using a cleaning solution that also contains one or more reducing agents. The reducing agent is selected so as to be substantially incapable of scavenging for dissolved oxygen. More specifically, the reducing agent is selected so as to provide a function other than scavenging for dissolved oxygen in the cleaning solution. A primary function of the reducing agent is to minimize unwanted anodic dissolution of the cap. This is done by the introduction of reducing agent in the cleaning solution. Depending on the type of reducing agent, the oxidation of these compounds is energetically more favorable than the oxidation and dissolution of the cap.

Numerous compounds are suitable for use as reducing agents in embodiments of the present invention. A list of reducing agents for embodiments of the present invention includes, but is not limited to, boron containing reducing agents, hypophosphites, thiosulfite, aldehydes, and combinations thereof. Some embodiments of the present invention include one or more reducing agents present in the cleaning solution in amounts ranging from about 0.1 gram per liter to about 10 grams per liter.

As an option, some embodiments of the present invention as presented in FIG. 1 may include using a cleaning solution that also contains one or more surface active agents. The surface active agent is included so as to provide adequate wetting of the substrate during the cleaning. Preferably, the entire surface of the substrate is adequately wetted by the cleaning solution so that the dielectric areas of the substrate are wetted and the cap areas of the substrate are wetted.

Numerous compounds are suitable for use as surface active agents in embodiments of the present invention. A list of surface active agents for embodiments of the present invention includes, but is not limited to, anionic surface active agents, cationic surface active agents, nonionic surface active agents, amphoteric surface active agents, and combinations thereof. Some embodiments of the present invention include one or more surface active agents present in the cleaning solution in amounts ranging from about 0.02 gram per liter to about 2 grams per liter. Preferably, if there are two or more surface active agents then each of the surface active agents is present in the cleaning solution in amounts from about 0.02 gram per liter to about 2 grams per liter.

As an option, some embodiments of the present invention as presented in FIG. 1 may include using a cleaning solution that also contains one or more water-soluble solvents. The water-soluble solvent is included so as to perform tasks such as to help remove organic contaminants from the surface of the substrate. The water-soluble solvent may also be included so as to perform tasks such as to help dissolve one or more additives included in the cleaning solution that may have a low or an insufficient solubility in water.

Numerous compounds are suitable for use as water-soluble solvents in embodiments of the present invention. A list of water-soluble solvents for embodiments of the present invention includes, but is not limited to, primary alcohols, secondary alcohols, tertiary alcohols, polyols, ethylene glycol, dimethylsulfoxide, propylenecarbonate, and combinations thereof. Some embodiments of the present invention include one or more water-soluble solvents present in the cleaning solution in amounts ranging from about 10 gram per liter to about 100 grams per liter.

As an option for some embodiments of the present invention as presented in FIG. 1, cleaning the substrate with the cleaning solution, step 40, can be performed using a brush to apply the cleaning solution to the substrate. Other embodiments of the present invention can be performed that include applying the cleaning solution to the substrate without using a brush; more specifically, the cleaning solution may be applied by methods such as dipping the substrate into the cleaning solution, such as spraying the cleaning solution onto the substrate, and such as applying the solution using a proximity head.

According to preferred embodiments of the present invention as presented in FIG. 1, the temperature for performing step 40, cleaning the substrate with a cleaning solution, is preferably in the range from about 5° C. to about 90° C. Preferably the temperature of the cleaning solution is controlled. As an option the temperature of the substrate may be controlled.

Preferred embodiments of the present invention as presented in FIG. 1 use a cleaning solution that also includes one or more additives such as a non-amine complexing agent substantially as described supra, a corrosion inhibitor substantially as described supra, a surface active agent substantially as described supra, an oxygen scavenger substantially as described supra, a reducing agent substantially as described supra, and a water soluble solvent substantially as described supra. This means that additional embodiments of the present invention are described by combinations of these additives provided in the cleaning solution for the process flow shown in FIG. 1. More specifically, the additives and combinations of the additives produce cleaning solutions having dissimilar compositions that define dissimilar embodiments of the invention presented in FIG. 1. A list of additional preferred compositions of cleaning solutions for preferred embodiments of the present invention as presented in FIG. 1 includes but is not limited to the following cleaning solutions:

1. The cleaning solution presented in FIG. 1 including an amount of complexing agent and an amount of corrosion inhibitor.
2. The cleaning solution presented in FIG. 1 including an amount of complexing agent and an amount of oxygen scavenger.
3. The cleaning solution presented in FIG. 1 including an amount of complexing agent and an amount of reducing agent.
4. The cleaning solution presented in FIG. 1 including an amount of complexing agent, an amount of corrosion inhibitor, and an amount of oxygen scavenger.
5. The cleaning solution presented in FIG. 1 including an amount of complexing agent, an amount of corrosion inhibitor, and an amount of reducing agent.
6. The cleaning solution presented in FIG. 1 including an amount of complexing agent, an amount of oxygen scavenger, and an amount of reducing agent.
7. The cleaning solution presented in FIG. 1 including an amount of complexing agent, an amount of oxygen scavenger, an amount of reducing agent, and an amount of corrosion inhibitor.
8. The cleaning solution presented in FIG. 1 including an amount of complexing agent, an amount of corrosion inhibitor, and an amount of surface active agent.
9. The cleaning solution presented in FIG. 1 including an amount of complexing agent, an amount of oxygen scavenger, and an amount of surface active agent.
10. The cleaning solution presented in FIG. 1 including an amount of complexing agent, an amount of reducing agent, and an amount of surface active agent.
11. The cleaning solution presented in FIG. 1 including an amount of complexing agent, an amount of corrosion inhibitor, an amount of oxygen scavenger, and an amount of surface active agent.
12. The cleaning solution presented in FIG. 1 including an amount of complexing agent, an amount of corrosion inhibitor, an amount of reducing agent, and an amount of surface active agent.
13. The cleaning solution presented in FIG. 1 including an amount of complexing agent, an amount of oxygen scavenger, an amount of reducing agent, and an amount of surface active agent.
14. The cleaning solution presented in FIG. 1 including an amount of complexing agent, an amount of oxygen scavenger, an amount of reducing agent, an amount of corrosion inhibitor, and an amount of surface active agent.
15. The cleaning solution presented in FIG. 1 including an amount of complexing agent, an amount of corrosion inhibitor, and an amount of water-soluble solvent.
16. The cleaning solution presented in FIG. 1 including an amount of complexing agent, an amount of oxygen scavenger, and an amount of water-soluble solvent.
17. The cleaning solution presented in FIG. 1 including an amount of complexing agent, an amount of reducing agent, and an amount of water-soluble solvent.

18. The cleaning solution presented in FIG. 1 including an amount of complexing agent, an amount of corrosion inhibitor, an amount of oxygen scavenger, and an amount of water-soluble solvent.
19. The cleaning solution presented in FIG. 1 including an amount of complexing agent, an amount of corrosion inhibitor, an amount of reducing agent, and an amount of water-soluble solvent.
20. The cleaning solution presented in FIG. 1 including an amount of complexing agent, an amount of oxygen scavenger, an amount of reducing agent, and an amount of water-soluble solvent.
21. The cleaning solution presented in FIG. 1 including an amount of complexing agent, an amount of oxygen scavenger, an amount of reducing agent, an amount of corrosion inhibitor, and an amount of water-soluble solvent.
22. The cleaning solution presented in FIG. 1 including an amount of complexing agent, an amount of corrosion inhibitor, an amount of surface active agent, and an amount of water-soluble solvent.
23. The cleaning solution presented in FIG. 1 including an amount of complexing agent, an amount of oxygen scavenger, an amount of surface active agent, and an amount of water-soluble solvent.
24. The cleaning solution presented in FIG. 1 including an amount of complexing agent, an amount of reducing agent, an amount of surface active agent, and an amount of water-soluble solvent.
25. The cleaning solution presented in FIG. 1 including an amount of complexing agent, an amount of corrosion inhibitor, an amount of oxygen scavenger, an amount of surface active agent, and an amount of water-soluble solvent.
26. The cleaning solution presented in FIG. 1 including an amount of complexing agent, an amount of corrosion inhibitor, an amount of reducing agent, an amount of surface active agent, and an amount of water-soluble solvent.
27. The cleaning solution presented in FIG. 1 including an amount of complexing agent, an amount of oxygen scavenger, an amount of reducing agent, an amount of surface active agent, and an amount of water-soluble solvent.
28. The cleaning solution presented in FIG. 1 including an amount of complexing agent, an amount of oxygen scavenger, an amount of reducing agent, an amount of corrosion inhibitor, an amount of surface active agent, and an amount of water-soluble solvent.
29. The cleaning solution presented in FIG. 1 including a corrosion inhibitor present in a concentration between about 0.01 g/L to about 10 g/L and an oxygen scavenger present in a concentration between about 0.05 g/L to about 10 g/L.
30. The cleaning solution presented in FIG. 1 including an amount of complexing agent, a corrosion inhibitor present at a concentration between about 0.01 g/L to about 20 g/L and a reducing agent present at a concentration between about 0.1 g/L to about 10 g/L.
31. The cleaning solution presented in FIG. 1 including an amount of complexing agent, an oxygen scavenger present at a concentration between about 0.05 g/L to about 10 g/L, and a reducing agent present at a concentration between about 0.1 g/L to about 10 g/L.
32. The cleaning solution presented in FIG. 1 including an amount of a complexing agent, a corrosion inhibitor present at a concentration between about 0.01 g/L to about 20 g/L, an oxygen scavenger present at a concentration between about 0.05 g/L to about 10 g/L, and a reducing agent present at a concentration between about 0.1 g/L to about 10 g/L.
33. The cleaning solution presented in FIG. 1 including an amount of non-amine complexing agent, an amount of corrosion inhibitor, an amount of surface active agent, an amount of oxygen scavenger, an amount of reducing agent, and an amount of water soluble solvent.
34. The cleaning solution presented in FIG. 1 having the amine at a concentration from about 1 g/L to about 100 g/L and the cleaning solution also including at least one of: an amount of non-amine complexing agent, an amount of corrosion inhibitor, an amount of surface active agent, an amount of oxygen scavenger, an amount of reducing agent, and an amount of water soluble solvent.
35. The cleaning solution presented in FIG. 1 having the amine at a concentration from about 1 g/L to about 100 g/L and the cleaning solution also including an amount of non-amine complexing agent, an amount of corrosion inhibitor, an amount of surface active agent, an amount of oxygen scavenger, an amount of reducing agent, and an amount of water soluble solvent.
36. The cleaning solution presented in FIG. 1 having the amine at a concentration from about 1 g/L to about 100 g/L and the cleaning solution also including at least one of: a non-amine complexing agent at a concentration from about 0.5 g/L to about 50 g/L; a corrosion inhibitor at a concentration from about 0.01 g/L to about 20 g/L; a surface active agent at a concentration of 0.02 to 2 g/L; an oxygen scavenger at a concentration from about 0.05 g/L to about 10 g/L; a reducing agent at a concentration from about 0.1 g/L to about 10 g/L; and a water soluble solvent at a concentration from about 10 g/L to about 100 g/L.
37. The cleaning solution presented in FIG. 1 having the amine at a concentration from about 1 g/L to about 100 g/L and the cleaning solution also including a non-amine complexing agent at a concentration from about 0.5 g/L to about 50 g/L; a corrosion inhibitor at a concentration from about 0.01 g/L to about 20 g/L; a surface active agent at a concentration of 0.02 g/L to 2 g/L; an oxygen scavenger at a concentration from about 0.05 g/L to about 10 g/L; a reducing agent at a concentration from about 0.1 g/L to about 10 g/L; and a water soluble solvent at concentration from about 10 g/L to about 100 g/L.
38. The cleaning solution presented in FIG. 1 having the amine at a concentration from about 1 g/L to about 100 g/L and the amine is selected form the group consisting of primary alkylamines, secondary alkylamines, tertiary alkylamines, quaternary alkylamines, primary arylamines, secondary arylamines, tertiary arylamines, quaternary arylamines, ammonia, primary alkanolamines, secondary alkanolamines, tertiary alkanolamines, ethanolamine, diethanolamine, triethanolamine, choline, amines with mixed alkyl and alkanol functionalities, tetramethylguanidine, and hydroxylamine; and the cleaning solution also including at least one of:
a complexing agent at a concentration from about 0.5 g/L to about 50 g/L selected from the group consisting of carboxylic acids, hydroxycarboxylic acids, amino acids, phosphonic acid, phytic acid, and organic acids where lg K for CoL>2;
a corrosion inhibitor at a concentration from about 0.01 g/L to about 20 g/L selected from the group consisting of triazole, benzotriazole, methyl-benzotriazole, carboxy-benzotriazole, hydroxybenzotriazole, thiazole, mercaptobenzothiazole, polyvinylpyrrolidone, polyvinylalcohol, polyalkylimines, polyethylenimines, long chain alkylamines, tetrazoles, orthophosphates, metaphosphates, phosphites, phosphonates, silicates, alkylphosphonates, alkoxysilanes, nitrites, and bicyclohexylammonium nitrite;

a surface active agent at a concentration of 0.02 g/L to 2 g/L selected from the group consisting of anionic surface active agents, cationic surface active agents, nonionic surface active agents, amphoteric surface active agents, and combinations thereof;

an oxygen scavenger at a concentration from about 0.05 g/L to about 10 g/L selected from the group consisting of hydroxylamine, diethylhydroxylamine, methyl-ethylketoxime, carbohydrazide, L-ascorbic acid, D-ascorbic acid, derivatives of ascorbic acid, chlorogenic acid, hydrazine, hydrazine salts, derivatives of hydrazine, caffeic acid, phytic acid, luteolin, and sulfites;

a reducing agent at a concentration from about 0.1 g/L to about 10 g/L selected from the group consisting of boron containing reducing agents, hypophosphites, thiosulfite, and aldehydes; and a water soluble solvent at a concentration from about 10 g/L to about 100 g/L selected from the group primary alcohols, secondary alcohols, tertiary alcohols, polyols, ethylene glycol, dimethylsulfoxide, propylenecarbonate, and mixtures thereof.

As an option for some embodiments of the present invention as represented in FIG. 1, any of the cleaning solution compositions, such as the cleaning solution compositions presented supra, can be applied to the substrate using a brush. Alternatively, any of the cleaning solution compositions, such as the cleaning solution compositions presented supra, can be applied to the substrate by methods other than using a brush. Another option for some embodiments of the present invention as represented in FIG. 1, any of the cleaning solution compositions, such as the cleaning solution compositions presented supra, can be used at temperatures in the range from about 5° C. to about 90° C. to clean the substrate.

As presented supra, numerous cleaning solution compositions are suitable for embodiments of the present invention. According to a preferred embodiment of the present invention, step 40, cleaning the substrate, is performed using cleaning solution compositions described supra and the concentration of dissolved oxygen in the cleaning solution is maintained at less than about 1 part per million. This means that for any of the selected cleaning solutions for embodiments of the present invention, it is preferred that the dissolved oxygen concentration in the cleaning solution is maintained at less than about 1 part per million when cleaning the substrate.

Another embodiment of the present invention comprises a method of cleaning a substrate for electronic devices. More specifically, it is a method of cleaning a substrate having copper and dielectric damascene metallization. The surface of the copper has a cap that includes cobalt, cobalt alloy, nickel, nickel alloy, or cobalt-nickel alloy. The method comprises applying a cleaning solution to the substrate to remove defects and/or contamination with negligible dissolution of the cap, the solution comprises one or more amines, at least one of the one or more amines provides a pH from 7 to 13 in the cleaning solution. According to a preferred embodiment of the present invention, the pH of the cleaning solution is a value from about 8 to about 11.5.

For the purpose of the present disclosure, cleaning the substrate includes removing contaminants, removing defects, or removing contaminants and removing defects. The composition of the cleaning solution is selected so as to facilitate removal of defects and/or contaminants from the surface of the substrate, more particularly the surface of the cap and surface of the dielectric. More preferably, the composition of the cleaning solution is selected so as to clean the surface of the cap and the surface of the dielectric with negligible or substantially no reduction in the thickness of the cap. Preferably, thickness of the cap is reduced by less than 15% as a result of the cleaning. More preferably, the thickness of the cap is reduced by less than 10% as a result of the cleaning. According to one embodiment of the present invention, the thickness of the cap is reduced by less than 1.5 nm.

Preferred embodiments of the method of cleaning substrates use a cleaning solution that also includes one or more additives such as a complexing agent substantially as described supra, a corrosion inhibitor substantially as described supra, a surface active agent substantially as described supra, an oxygen scavenger substantially as described supra, a reducing agent substantially as described supra, and a water soluble solvent substantially as described supra. This means that additional embodiments of the present invention are described by combinations of these additives provided in the cleaning solution. More specifically, the additives and combinations of the additives produce cleaning solutions having dissimilar compositions that define dissimilar embodiments of the method of cleaning substrates. The combination of additives and amounts of the additives are selected so that the cleaning solution is effective for cleaning the substrate without significantly reducing the thickness of the cap. A list of additional preferred compositions for preferred embodiments of the method of cleaning substrates includes but is not limited to the cleaning solutions described supra for embodiments of process flow 20.

Another embodiment of the present invention is a cleaning solution for an integrated circuit substrate. The cleaning solution comprises an amine at a concentration from about 1 g/L to about 100 g/L to provide a pH for the cleaning solution of 7 to 13 and all values and subranges subsumed therein. More specifically, the amine is capable of raising the pH of the solution to a value above 7 and less than about 13. According to a preferred embodiment of the present invention, the pH of the cleaning solution is a value from about 8 to about 11.5. The solution also includes at least one additive selected from the group consisting of:

a non-amine complexing agent at a concentration from about 0.5 g/L to about 50 g/L;

a corrosion inhibitor at a concentration from about 0.01 g/L to about 20 g/L;

a surface active agent at a concentration of 0.02 g/L to 2 g/L;

an oxygen scavenger at a concentration from about 0.05 g/L to about 10 g/L;

a reducing agent at a concentration from about 0.1 g/L to about 10 g/L, the reducing agent having substantially no oxygen scavenging properties; and a water soluble solvent at a concentration from about 10 to about 100 g/L.

As an alternative, the cleaning solution also includes at least two additives selected from the group consisting of a non-amine complexing agent at a concentration from about 0.5 g/L to about 50 g/L;

a corrosion inhibitor at a concentration from about 0.01 g/L to about 20 g/L;

a surface active agent at a concentration of 0.02 g/L to 2 g/L;

an oxygen scavenger at a concentration from about 0.05 g/L to about 10 g/L;

a reducing agent at a concentration from about 0.1 g/L to about 10 g/L, the reducing agent having substantially no oxygen scavenging properties; and a water soluble solvent at a concentration from about 10 g/L to about 100 g/L.

As another alternative, the cleaning solution also includes at least three additives selected from the group consisting of a non-amine complexing agent at a concentration from about 0.5 g/L to about 50 g/L;

a corrosion inhibitor at a concentration from about 0.01 g/L to about 20 g/L;

a surface active agent at a concentration of 0.02 g/L to 2 g/L;

an oxygen scavenger at a concentration from about 0.05 g/L to about 10 g/L;

a reducing agent at a concentration from about 0.1 g/L to about 10 g/L, the reducing agent having substantially no oxygen scavenging properties; and a water soluble solvent at a concentration from about 10 g/L to about 100 g/L.

For still another alternative, the cleaning solution also includes at least four additives selected from the group consisting of a non-amine complexing agent at a concentration from about 0.5 g/L to about 50 g/L;

a corrosion inhibitor at a concentration from about 0.01 g/L to about 20 g/L;

a surface active agent at a concentration of 0.02 g/L to 2 g/L;

an oxygen scavenger at a concentration from about 0.05 g/L to about 10 g/L;

a reducing agent at a concentration from about 0.1 g/L to about 10 g/L, the reducing agent having substantially no oxygen scavenging properties; and a water soluble solvent at a concentration from about 10 g/L to about 100 g/L.

Another embodiment of the present invention is a cleaning solution for an integrated circuit substrate. The cleaning solution comprises an amine to provide a pH for the cleaning solution of 7 to 13 and all values and subranges subsumed therein, a complexing agent, a corrosion inhibitor, a surface active agent, an oxygen scavenger, a reducing agent, and a water soluble solvent. Each of the components of the solution and amounts of each of the components are included so as to make the cleaning solution effective for cleaning the integrated circuit substrate. Additional description of properties and compounds for components of the solution for embodiments of the present invention are presented supra.

Reference is now made to Table 1 where there is shown a summary of solution compositions for embodiments of the present invention and results for seven experiments using the solution compositions. The solutions were used to clean substrate surfaces having a cap layer comprising a cobalt tungsten phosphorous composite. The cleaning step was done at about room temperature. The surfactant Triton X-100® is a registered trademark of Union Carbide and has the chemical formula $(C_{14}H_{22}O(C_2H_4O)_n)$. The etch rates of the cap are low and meet the requirements for manufacturing operations.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

As used herein, the terms "comprises," "comprising," "includes," "including," "has," "having," "at least one of," or any other variation thereof, are intended to cover a non-exclusive inclusion. For example, a process, method, article, or apparatus that comprises a list of elements is not necessarily limited only to those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

TABLE 1

| Example # | Amine 1 | Amine 2 (to adjust pH) | Complexing agent | Inhibitor | Oxygen scavenger | Reducing agent | Surfactant | Solvent | pH | CoWP etch in 30 min/A |
|---|---|---|---|---|---|---|---|---|---|---|
| 1 | 2 g/L hydroxyl-amine | TMAH | | | | | | | 10.7 | 1 |
| 2 | 5 g/L diethanol-amine | TMAH | | 1 g/L boric acid | | | | | 10.7 | 3 |
| 3 | 5 g/L diethanol-amine | TMAH | | 1 g/L boric acid | | | 0.5 g/L Triton X-100 ® | | 10.7 | 3 |
| 4 | 5 g/L diethanol-amine | TMAH | 2 g/L citric acid | | 2 g/L L-Ascorbic acid | | | | 11 | 1 |
| 5 | 5 g/L diethanol-amine | TMAH | 2 g/L citric acid | | 2 g/L L-Ascorbic acid | | | 10 g/L isopropanol | 11 | 1 |

TABLE 1-continued

| Example # | Amine 1 | Amine 2 (to adjust pH) | Complexing agent | Inhibitor | Oxygen scavenger | Reducing agent | Surfactant | Solvent | pH | CoWP etch in 30 min/A |
|---|---|---|---|---|---|---|---|---|---|---|
| 6 | 5 g/L diethanolamine | | | | 2 g/L L-Ascorbic acid | 1.2 g/L Dimethylamine borane | | | 10.7 | 0 |
| 7 | 5 g/L diethanolamine | TMAH | 2 g/L Glycolic acid | 1 g/L benzotriazole-5-carboxylic acid | | | 0.5 g/L Triton X-100 ® | | 10.7 | 5 |

TMAH—tetramethylammonium hydroxide

What is claimed is:

1. A method of cleaning a substrate having copper and dielectric damascene metallization, the surface of the copper having a cap of cobalt, cobalt alloy, nickel, nickel alloy, or cobalt-nickel alloy film, the method comprising:
applying a cleaning solution to the substrate to remove at least one of defects and contamination, wherein the cleaning solution comprises an amine at a concentration from about 1 g/L to about 100 g/L to provide a pH for the cleaning solution of 7 to 13 and all values and subranges subsumed therein; a non-amine complexing agent at a concentration from about 0.5 g/L to about 50 g/L; a corrosion inhibitor at a concentration from about 0.01 g/L to about 20 g/L; a surface active agent at a concentration of 0.02 g/L to 2 g/L; an oxygen scavenger at a concentration from about 0.05 g/L to about 10 g/L, the oxygen scavenger comprising hydroxylamine, diethylhydroxylamine, methyl-ethylketoxime, carbohydrazide, chlorogenic acid, hydrazine, hydrazine salts, derivatives of hydrazine, caffeic acid, phytic acid, luteolin, and/or sulfites; a reducing agent at a concentration from about 0.1 g/L to about 10 g/L, the reducing agent comprising a boron containing reducing agent, a hypophosphite, and/or a thiosulfate; and a water soluble solvent at concentration from about 10 g/L to about 100 g/L.

2. A method of fabricating an integrated circuit, the method comprising:
providing a substrate having a metal and dielectric damascene metallization layer using electroless deposition to deposit on the metal a cap comprising at least one of the elements cobalt and nickel;
cleaning the substrate after deposition of the cap with a cleaning solution comprising a first amine; a second amine to provide a pH for the cleaning solution of 7 to 13 and all values and subranges subsumed therein; at least one complexing agent; one or more corrosion inhibitors; one or more surface active agents; at least one oxygen scavenger to lower the dissolved oxygen concentration in the cleaning solution to less than 1 ppm; at least one reducing agent selected from the group consisting of boron containing reducing agents, hypophosphites, and thiosulfate; and at least one water-soluble solvent.

3. The method of claim 2, wherein at least one of the one or more complexing agents is a non-amine.

4. The method of claim 2, wherein the one or more corrosion inhibitors protect the cap or retard the dissolution of the cap in the cleaning solution.

5. The method of claim 2, wherein the one or more surface active agents provide adequate wetting of the substrate.

6. The method of claim 2, wherein the concentration of the second amine is from about 1 g/L to about 100 g/L.

7. The method of claim 2, wherein the second amine is selected from the group consisting of primary alkylamines, secondary alkylamines, tertiary alkylamines, quarternary alkylamines, primary arylamines, alkanolamines, secondary alkanolamines, tertiary alkanolamines, ethanolamine, diethanolamine, triethanolamine, choline, amines with mixed alkyl and alkanol functionalities, tetramethylguanidine, and hydroxylamine.

8. The method of claim 2, wherein the at least one complexing agent concentration is from about 0.5 g/L to about 50 g/L.

9. The method of claim 2, wherein the at least one complexing agent concentration is a value from about 0.5 g/L to about 50 g/L, and the at least one complexing agent is selected from the group consisting of carboxylic acids, hydroxycarboxylic acids, amino acids, phosphonic acid, phytic acid, and organic acids wherein lg K for CoL>2.

10. The method of claim 2, wherein the one or more corrosion inhibitors concentration is between 0.01 g/L to 20 g/L.

11. The method of claim 2, wherein the one or more corrosion inhibitors are selected from the group consisting of triazole, benzotriazole, methyl-benzotriazole, carboxy-benzotriazole, hydroxybenzotriazole, thiazole, mercaptobenzothiazole, polyvinylpyrrolidone, polyvinylalcohol, polyalkylimines, polyethylenimines, long chain alkylamines, tetrazoles, orthophosphates, metaphosphates, phosphites, phosphonates, silicates, alkylphosopohnates, alkoxysilanes, nitrites, and bicycloshexylammonium nitrite.

12. The method of claim 2, wherein the oxygen scavenger concentration is between 0.05 g/L to 10 g/L.

13. The method of claim 2, wherein the at least one oxygen scavenger is selected from the group consisting of hydroxylamine, diethylhydroxylamine, methyl-ethylketoxime, carbohydrazide, L-ascorbic acid, D-ascorbic acid, derivatives of ascorbic acid, chlorogenic acid, hydrazine, hydrazine salts, derivatives of hydrazine, caffeic acid, phytic acid, luteolin, and sulfites.

14. The method of claim 2, wherein the reducing agent concentration is between 0.1 g/L to 10 g/L.

15. The method of claim 2, wherein the cleaning solution further comprises a corrosion inhibitor present in a concentration between 0.01 g/L to about 10 g/L and an oxygen scavenger present in a concentration between about 0.05 g/L to about 10 g/L.

16. The method of claim 2, wherein the at least one corrosion inhibitor concentration is between 0.01 g/L to about 20 g/L and the at least one reducing agent concentration is between about 0.1 g/L to about 10 g/L.

17. The method of claim 2, wherein the oxygen scavenger concentration is between about 0.05 g/L to about 10 g/L and the reducing agent concentration is between about 0.1 g/L to about 10 g/L.

18. The method of claim 2, wherein the one or more corrosion inhibitors concentration is between about 0.01 g/L to about 20 g/L, the at least one oxygen scavenger concentration is between about 0.05 g/L to about 10 g/L, and the at least one reducing agent concentration is between about 0.1 g/L to about 10 g/L.

19. The method of claim 2, wherein the one or more surface active agents are present in a concentration of about 0.02 g/L to about 2 g/L for each of the one or more surface active agents and the one or more surface active agents are anionic, cationic, nonionic, amphoteric, or mixtures thereof.

20. The method of claim 2, wherein the at least one water soluble solvent is present in a concentration from about 10 g/L to about 100 g/L.

21. The method of claim 2, wherein the at least one water soluble solvent comprises primary alcohols, secondary alcohols, tertiary alcohols, polyols, ethylene glycol, dimethylsulfoxide, or propylenecarbonate.

22. The method of claim 2, further comprising applying the cleaning solution to the substrate with a brush.

23. The method of claim 2, further comprising cleaning the substrate with the cleaning solution at a temperature in the range from about 5° C. to about 90° C.

* * * * *